US007916506B2

(12) United States Patent
Zhang et al.

(10) Patent No.: US 7,916,506 B2
(45) Date of Patent: Mar. 29, 2011

(54) CONTROL DEVICE FOR USE IN A RESONANT DIRECT CURRENT/DIRECT CURRENT CONVERTER

(75) Inventors: Qingyou Zhang, Taipei (TW); Xiaoyi Jin, Taipei (TW); Xin Guo, Taipei (TW); Zhihong Ye, Taipei (TW); Qinglin Zhao, Taipei (TW)

(73) Assignee: Lite-On Technology Corp., Taipei (TW)

( * ) Notice: Subject to any disclaimer, the term of this patent is extended or adjusted under 35 U.S.C. 154(b) by 212 days.

(21) Appl. No.: 12/395,887

(22) Filed: Mar. 2, 2009

(65) Prior Publication Data
US 2009/0219070 A1    Sep. 3, 2009

(30) Foreign Application Priority Data

Mar. 3, 2008    (TW) .............................. 97107284 A

(51) Int. Cl.
*H02M 3/335* (2006.01)
(52) U.S. Cl. ............... 363/21.02; 363/21.03; 363/21.04; 363/21.1; 363/21.11
(58) Field of Classification Search .............. 363/21.02, 363/21.03, 21.1, 21.11, 21.18, 74, 97
See application file for complete search history.

(56) References Cited

U.S. PATENT DOCUMENTS

| | | | | |
|---|---|---|---|---|
| 4,533,863 A | * | 8/1985 | Luhn et al. | 322/28 |
| 5,267,138 A | * | 11/1993 | Shores | 363/98 |
| 5,361,021 A | * | 11/1994 | Meyer et al. | 318/400.25 |
| 5,699,238 A | * | 12/1997 | Lee et al. | 363/21.03 |
| 5,783,799 A | * | 7/1998 | Geissler | 219/137 PS |
| 2008/0198638 A1 | * | 8/2008 | Reinberger et al. | 363/74 |

* cited by examiner

*Primary Examiner* — Adolf Berhane
*Assistant Examiner* — Jeffrey Gblende
(74) *Attorney, Agent, or Firm* — Rosenberg, Klein & Lee

(57) ABSTRACT

A control device for controlling a switch unit of a resonant direct current/direct current converter includes a frequency modulation controller and a pulse selector. The frequency modulation controller is adapted to be coupled electrically to the converter for receiving a correcting threshold value and output information of the converter, and for generating a synchronization signal according to the correcting threshold value and the output information received thereby. The pulse selector is adapted to be coupled electrically to the converter and the frequency modulation controller for receiving the correcting threshold value, the output information and the synchronization signal, and for generating a driving signal according to the correcting threshold value, the output information and the synchronization signal received thereby. The driving signal is adapted to drive the switch unit and has a working period. The driving signal switches between high and low signal levels at a frequency that is substantially equal to that of the synchronization signal during the working period.

10 Claims, 5 Drawing Sheets

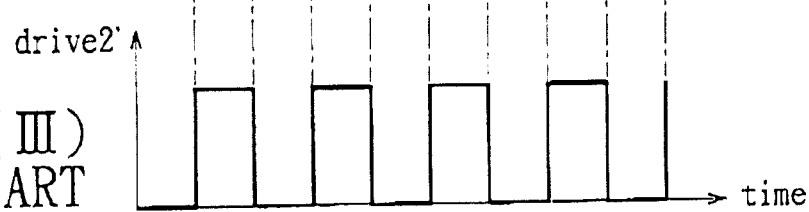
FIG. 2(III)
PRIOR ART

US 7,916,506 B2

CONTROL DEVICE FOR USE IN A RESONANT DIRECT CURRENT/DIRECT CURRENT CONVERTER

CROSS-REFERENCE TO RELATED APPLICATION

This application claims priority of Taiwanese Application No. 097107284, filed on Mar. 3, 2008.

BACKGROUND OF THE INVENTION

1. Field of the Invention

The invention relates to a control device for use in a resonant direct current/direct current converter.

2. Description of the Related Art

As shown in FIG. 1, a conventional LLC half bridge resonant direct current/direct current converter 8 performs voltage conversion or a direct current input power (not shown) so as to result in an output voltage ($V_{out}'$) adapted for driving a load (not shown). The conventional LLC half bridge resonant direct current/direct current converter 8 includes a switch unit 81, a resonating unit (not shown), a rectifying unit (not shown), and an output filter unit (not shown). The switch unit 81 is controlled by a frequency modulation controller 9, and affects magnitude of a current ($I_B'$) (as shown in FIG. 2(I)) through the resonant inductor.

In particular, the switch unit 81 receives a first driving signal (drive1') (as shown in FIG. 2(II)) and a second driving signal (drive2') (as shown in FIG. 2(III)) from the frequency modulation controller 9, and receives the input direct current input power switchingly according to the first and second driving signals (drive1', drive2') for generating the output voltage ($V_{out}'$) through voltage conversion to be received by the load. The output power of the conventional LLC half bridge resonant direct current/direct current converter 8 varies with loading conditions, while the output voltage ($V_{out}'$) remains unchanged.

The frequency modulation controller 9 receives the output voltage ($V_{out}'$), and adjusts the frequency of each of the first and second driving signals (drive1', drive2') according to the output voltage ($V_{out}'$) adjuster of an output voltage adjuster, which is a part of the frequency modulation controller 9, so as to determine state of the switch unit 81 (i.e., to be switched on or off), to thereby achieve control of the output voltage ($V_{out}'$).

As the load becomes lighter, the output power is reduced. The frequency modulation controller 9 increases the frequency of each of the first and second driving signals (drive1', drive2'). As a result, the switch unit 81, being controlled at a higher frequency by the first and second driving signals (drive1', drive2'), switches at a higher rate, thereby increasing the number of switching actions. Consequently, the overall power conversion efficiency of the conventional LLC half bridge resonant direct current/direct current converter 8 is reduced.

U.S. Pat. No. 6,545,882 utilizes an off-time modulator that generates a discharge current to solve the above-identified problem.

SUMMARY OF THE INVENTION

The object of the present invention is to provide a control device for use in a resonant direct current/direct current converter and capable of reducing number of switching actions of the converter and increasing power conversion efficiency of the converter under a relatively light loading condition.

According to the present invention, there is provided a control device adapted for use in a resonant direct current/direct current converter for controlling a switch unit of the resonant direct current/direct current converter. The control device includes a frequency modulation controller and a pulse selector.

The frequency modulation controller is adapted to be coupled electrically to the resonant direct current/direct current converter for receiving a correcting threshold value and the output information of the resonant direct current/direct current converter, and for generating a synchronization signal according to a correcting threshold value and the output information received thereby.

The pulse selector is adapted to be coupled electrically to the resonant direct current/direct current converter and the frequency modulation controller for receiving the correcting threshold value, the output information and the synchronization signal, and for generating a driving signal according to the correcting threshold value, the output information, and the synchronization signal received thereby.

The driving signal is adapted to drive the switch unit of the resonant direct current/direct current converter, and has a working period. The driving signal switches between high and low signal levels at a frequency that is substantially equal to that of the synchronization signal during the working period.

BRIEF DESCRIPTION OF THE DRAWINGS

Other features and advantages of the present invention will become apparent in the following detailed description of the preferred embodiment with reference to the accompanying drawings, of which:

FIG. 6(I) to FIG. 6(VII) are waveform diagrams, respectively illustrating a plurality of signals relevant to operation of the preferred embodiment.

DETAILED DESCRIPTION OF THE PREFERRED EMBODIMENT

Figure 3:
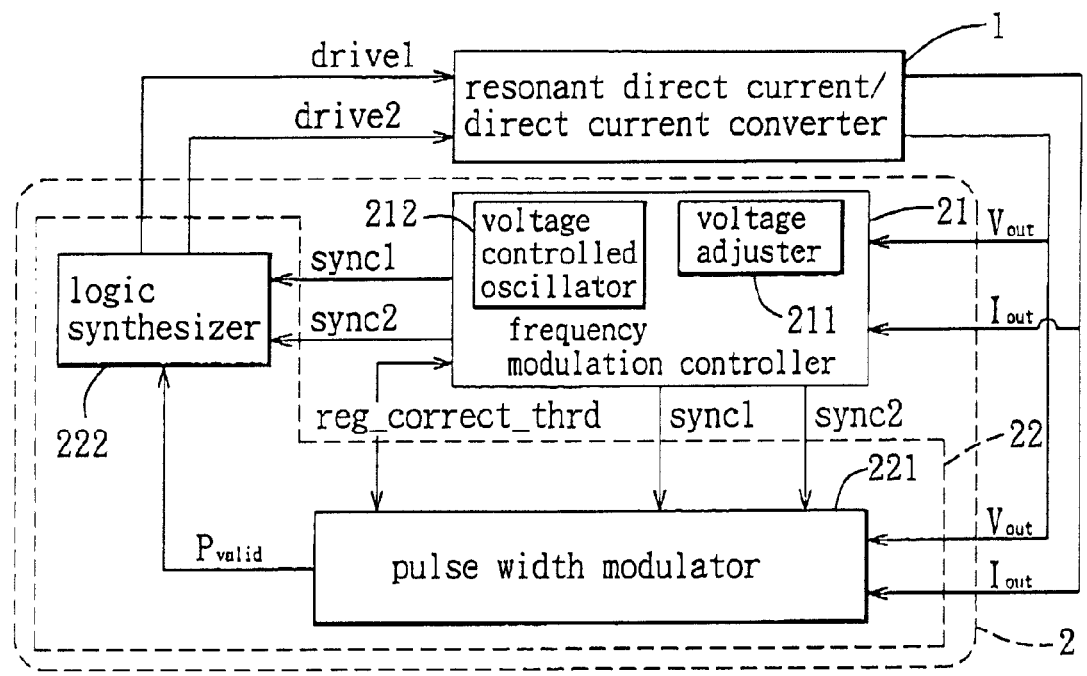
FIG. 3 is a block diagram of the preferred embodiment of a control device according to the present invention when applied to a resonant direct current/direct current converter.
Figure 4:
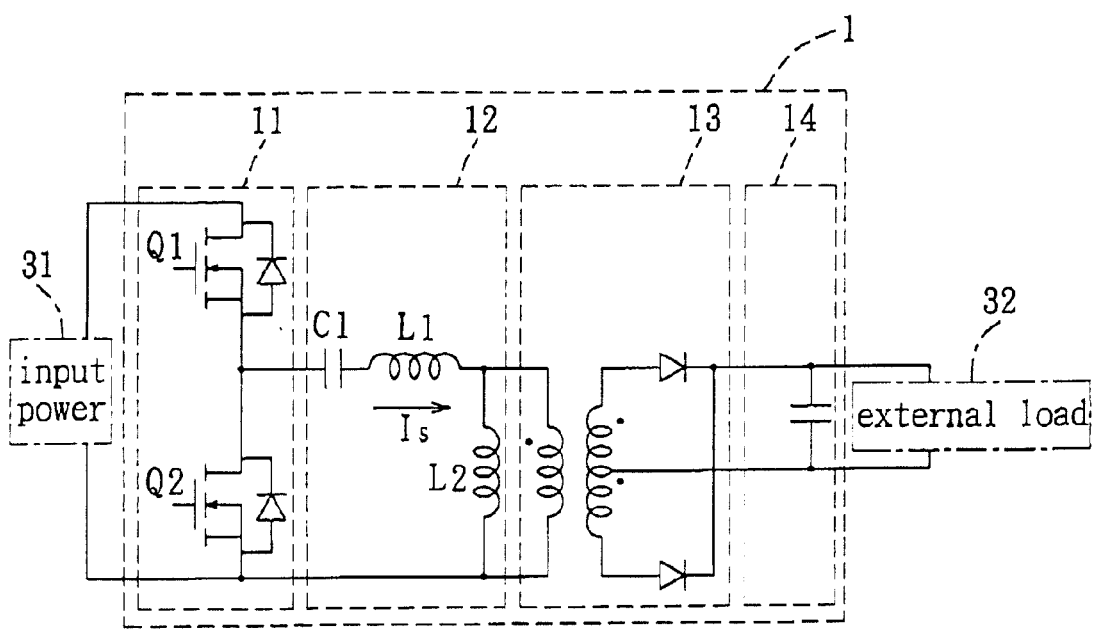
FIG. 4 is a circuit diagram, illustrating the resonant direct current/direct current converter.

With reference to FIG. 3 and FIG. 4, the preferred embodiment of a control device 2 according to the present invention is adapted for use in a resonant direct current/direct current converter 1 for controlling a switch unit 11 of the resonant direct current/direct current converter 1. The resonant direct current/direct current converter 1 performs conversion on an input power 31 so as to transfer energy to an external load 32 that is connected thereto. The resonant direct current/direct current converter 1 generates output information that includes an output voltage ($V_{out}$) and an output current ($I_{out}$).

In addition to the switch unit 11, the resonant direct current/direct current converter 1 further includes a resonating unit 12, a rectifying unit 13, and an output filter unit 14. The switch unit 11 includes a first transistor (Q1) and a second transistor (Q2). The resonating unit 12 includes a first capacitor (C1), a first inductor (L1), and a second inductor (L2). The first inductor (L1) has a resonating current ($I_a$) flowing therethrough. Since the resonant direct current/direct current converter 1 is known in the art, further details of the same are omitted herein for the sake of brevity.

In this embodiment, the resonant direct current/direct current converter 1 is an asymmetrical half bridge LLC resonant converter. However, it should be noted herein that the control device 2 of the present invention is also applicable for use in other types of resonant direct current/direct current converters, such as symmetrical LLC, full bridge LLC resonant direct current/direct current converters, etc. In other words, the present invention is not limited in this aspect.

The control device 2 generates a first driving signal (drive1) and a second driving signal (drive2) according to a correcting threshold value (reg_correct_thrd), the output voltage ($V_{out}$), and the output current ($I_{out}$), so as to determine conducting states of the first transistor (Q1) and the second transistor (Q2) of the switch unit 11. The control device 2 includes a frequency modulation controller 21 and a pulse selector 22. The frequency modulation controller 21 is adapted to be coupled electrically to the resonant direct current/direct current converter 1 for receiving the correcting threshold value (reg_correct_thrd) and the output information of the resonant direct current/direct current converter 1, and for generating first and second synchronization signals (sync1, sync2) according to the correcting threshold value (reg_correct_thrd) and the output information received thereby. The pulse selector 22 is adapted to be coupled electrically to the resonant direct current/direct current converter 1 and the frequency modulation controller 21 for receiving the correcting threshold value (reg_correct_thrd), the output information and the first and second synchronization signals (sync1, sync2), and for generating the first and second driving signals (drive1, drive2) according to the correcting threshold value (reg_correct_thrd), the output information and the first and second synchronization signals (sync1, sync2) received thereby. The first and second driving signals (drive1, drive2) are respectively adapted to drive the first and second transistors (Q1, Q2) of the switch unit 11 of the resonant direct current/direct current converter 1. Each of the first and second driving signals (drive1, drive2) has a working period, and switches between high and low signal levels at a frequency that is substantially equal to that of a corresponding one of the first and second synchronization signals (sync1, sync2) during the working period.

Figure 7:
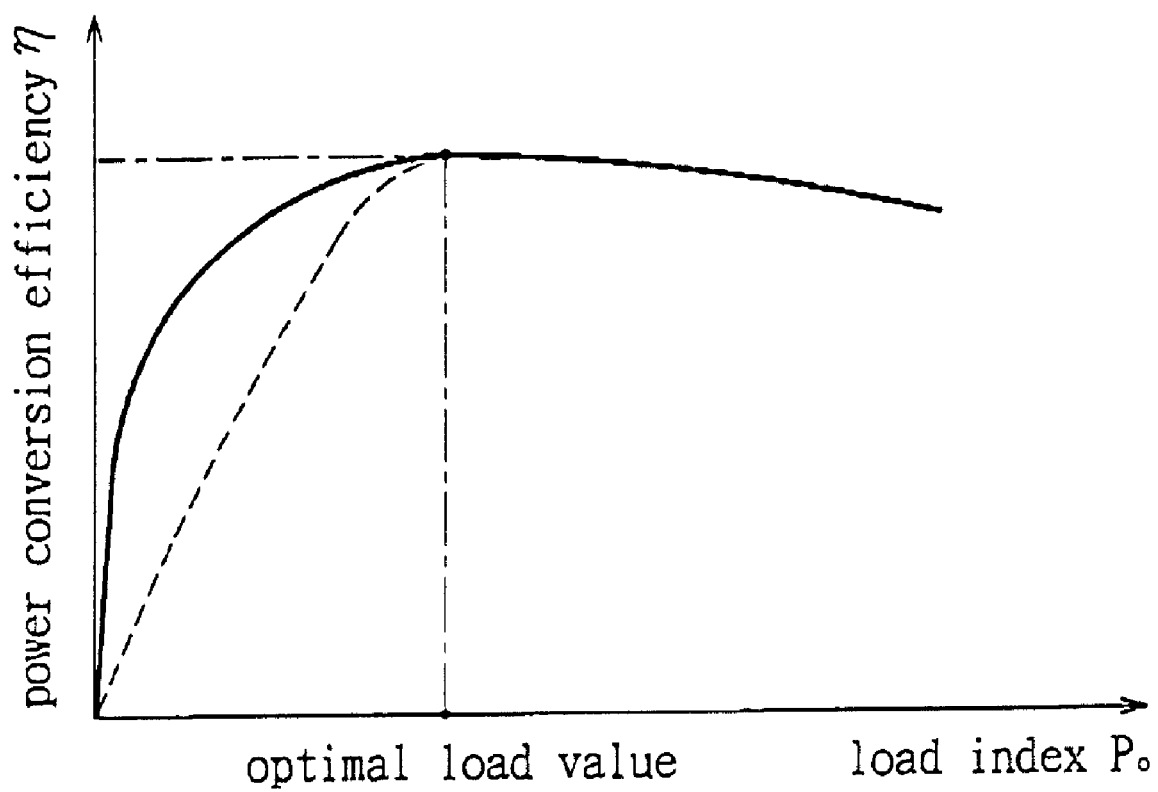
FIG. 7 is a plot to illustrate power conversion efficiency of the resonant direct current/direct current converter when the preferred embodiment is applied thereto.

In this embodiment, the frequency modulation controller 21 includes a voltage adjuster 211 and a voltage controlled oscillator (VCO) 212, while the pulse selector 22 includes a pulse width modulator 221 and a logic synthesizer 222. Each of the frequency modulation controller 21 and the pulse width modulator 221 receives the correcting threshold value (reg_correct_thrd), which is determined by an optimal load value which is illustrated in FIG. 7.

Figure 5:
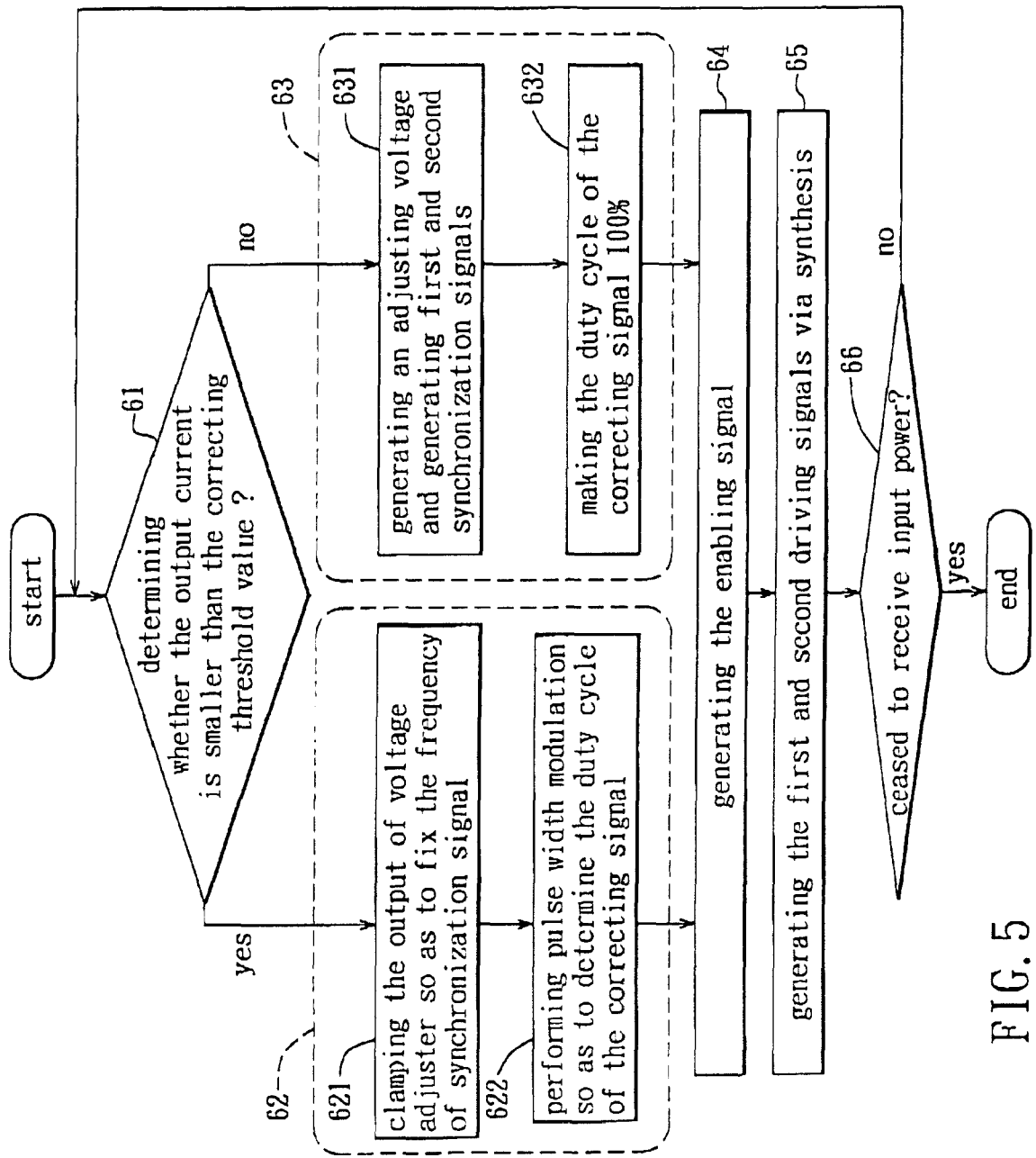
FIG. 5 is a flow chart, illustrating a control method performed by the preferred embodiment.

With further reference to FIG. 5, the control device 2 is used to perform a control method that includes the following steps for controlling the resonant direct current/direct current converter 1.

In step 61, the controller device 2 determines whether the output current ($I_{out}$) is smaller than the correcting threshold value (reg_correct_thrd). If affirmative, the process continues to step 62; otherwise, the process jumps to step 63.

Figure 6:
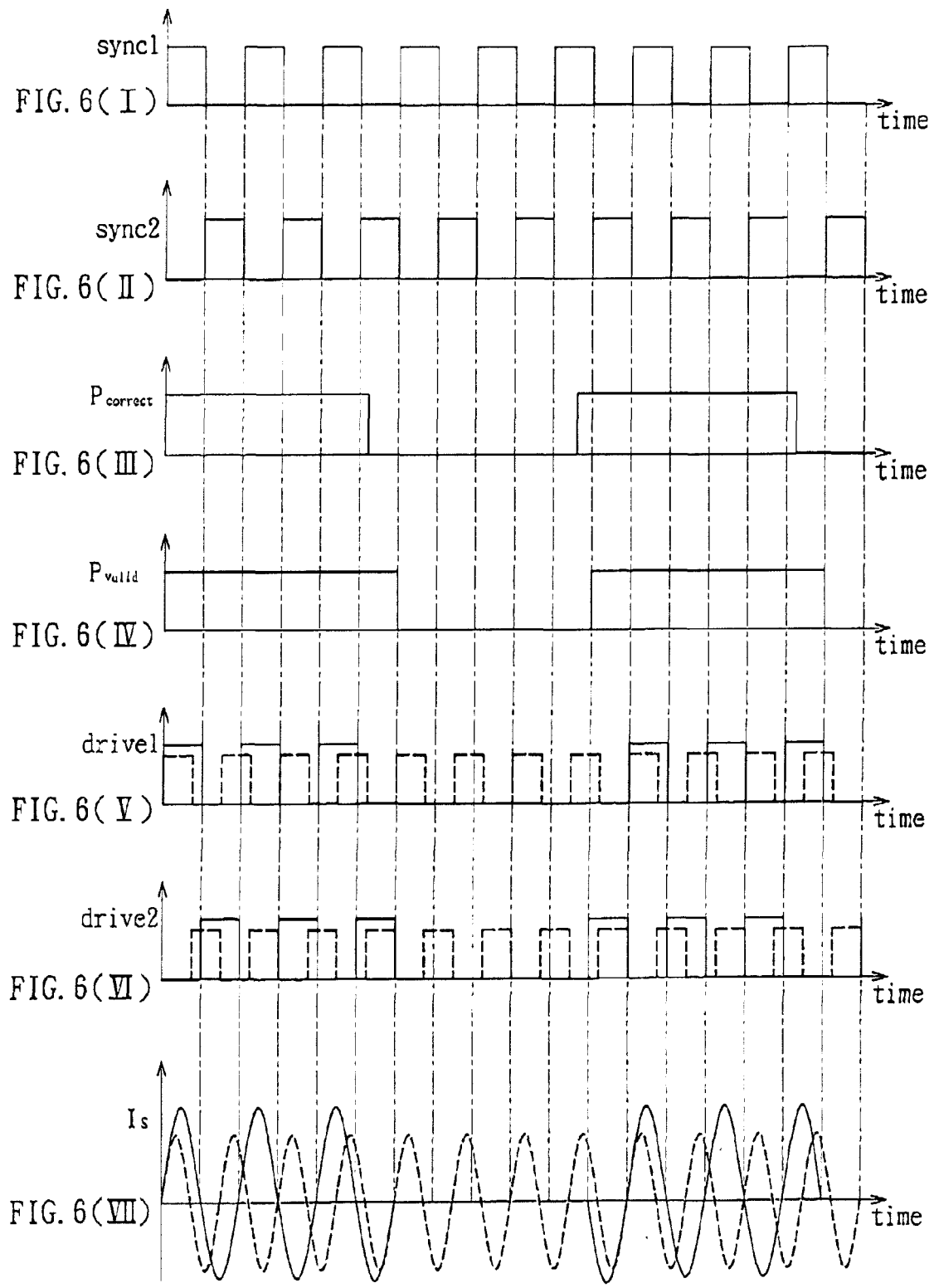

In step 62 and step 63, the frequency modulation controller 21 generates the first synchronization signal (sync1) according to the correcting threshold value (reg_correct_thrd) and the output information, and the second synchronization signal (sync2) that has a phase inverse to that of the first synchronization signal (sync1). Exemplary waveforms of the first and second synchronization signals (sync1, sync2) are illustrated in FIG. 6(I) and FIG. 6(II), respectively.

In this embodiment, the frequency modulation controller 21 is a variable frequency controller, but is not limited thereto in other embodiments of the present invention. The variable frequency controller determines a frequency (i.e., inverse of a period) of each of the first and second synchronization signals (sync1, sync2) according to an amplitude of the output of the voltage adjuster 211. In particular, the frequency of the first and second synchronization signals (sync1, sync2) varies inversely with the amplitude of the output of the voltage adjuster 211 of the frequency modulation controller 21.

Also in step 62 and step 63, the pulse width modulator 221 of the pulse selector 22 generates an enabling signal ($P_{valid}$) according to the output information of the resonant direct current/direct current converter 1. In particular, the pulse width modulator 221 generates a correcting signal ($P_{correct}$) having a duty cycle that is determined by the output information to make sure the output voltage ($V_{out}$) has an unchanged value, and further generates the enabling signal ($P_{valid}$) from the correcting signal ($P_{correct}$) with reference to the first synchronization signal (sync1).

Step 62 includes the following sub-steps.

In sub-step 621, the output of voltage adjuster 211 of the frequency modulation controller 21 is clamped, and the voltage controlled oscillator 212 generates the first and second synchronization signals (sync1, sync2) according to the clamped adjusting voltage. The frequency of the first and second synchronization signals (sync1, sync2) is fixed because of the clamped adjusting voltage.

In sub-step 622, the pulse width modulator 221 performs pulse width modulation according to the output information so as to determine the duty cycle of the correcting signal ($P_{correct}$), and then the process continues to step 64. The correcting signal ($P_{correct}$) has a frequency that is smaller than that of the first synchronization signal (sync1).

The output voltage ($V_{out}$) is maintained unchanged by changing the duty cycle of the correcting signal ($P_{correct}$) when the external load 32 changes. The duty cycle of the correcting signal ($P_{correct}$) is decreased as the output current ($I_{out}$) decreases when the output current ($I_{out}$) is smaller than the correcting threshold value (reg_correct_thrd).

Step 63 includes the following sub-steps.

In sub-step 631, the voltage adjuster 211 of the frequency modulation controller 21 generates an adjusting voltage by comparing the output voltage ($V_{out}$) with a reference voltage.

The output of the voltage adjuster 211 varies according to variations in the external load 32. The voltage adjuster 211 decreases the adjusting voltage when the external load 32 becomes heavier, and conversely increases the adjusting voltage when the external load 32 becomes lighter. In other words, the adjusting voltage varies inversely with the output current ($I_{out}$).

In addition, the voltage controlled oscillator 212 generates the first and second synchronization signals (sync1, sync2) according to the adjusting voltage.

The frequency of the first and second synchronization signals (sync1, sync2) is decreased as the adjusting voltage decreases when the external load 32 becomes heavier (i.e., an increase in the output current ($I_{out}$)). On the contrary, the frequency of the first and second synchronization signals (sync1, sync2) is increased as the adjusting voltage increases when the external load 32 becomes lighter (i.e., a decrease in the output current ($I_{out}$)). Consequently, the frequency of the first and second synchronization signals (sync1, sync2) varies inversely with the output current ($I_{out}$) of the resonant direct current/direct current converter 1.

In sub-step 632, the pulse width modulator 221 makes the duty cycle of the correcting signal ($P_{correct}$) to be at 100% such that the correcting signal ($P_{correct}$) is maintained at the high signal level. In other words, the duty cycle of the correcting signal ($P_{correct}$) is 100% when the output current ($I_{out}$) is at least equal to the correcting threshold value (reg_correct_thrd).

In step 64, the pulse width modulator 221 generates the enabling signal ($P_{valid}$) from the correcting signal ($P_{correct}$) with reference to the first synchronization signal (sync1) such that the enabling signal ($P_{valid}$) is in sync with the first synchronization signal (sync1). As such, the enabling signal ($P_{valid}$) also has a frequency smaller than that of the first synchronization signal (sync1). In other words, with reference to FIG. 6(I), FIG. 6(III) and FIG. 6(IV), clocking characteristic of the enabling signal ($P_{valid}$) is as follows: as time passes, the state of the enabling signal ($P_{valid}$) basically follows that of the correcting signal ($P_{correct}$), except that during on and off switching of the correcting signal ($P_{correct}$) between high and low signal levels, the enabling signal ($P_{valid}$) does not switch between high and low signal levels until a subsequent switching of the first synchronization signal (sync1) between high and low signal levels.

This step is necessary because the correcting signal ($P_{correct}$) is not necessarily in sync with the first synchronization signal (sync1), i.e., a switching point of the correcting signal ($P_{correct}$) does not necessarily coincide with a switching point of the first synchronization signal (sync1), where the switching point refers to the point in time at which the signal switches between the high and low signal levels. Therefore, the step 64 is performed to generate the enabling signal ($P_{valid}$) that is in sync with the first synchronization signal (sync1).

In this embodiment, the switching point of the first synchronization signal (sync1) refers to a rising/falling edge of the first synchronization signal (sync1). It should be noted herein that the pulse width modulator 221 may also generate the enabling signal ($P_{valid}$) from the correcting signal ($P_{correct}$) with reference to the second synchronization signal (sync2) in other embodiments of the present invention.

In step 65, the logic synthesizer 222 of the pulse selector 22 generates the first driving signal (drive1) according to the enabling signal ($P_{valid}$) and the first synchronization signal (sync1), and further generates the second driving signal (drive2) according to the enabling signal ($P_{valid}$) and the second synchronization signal (sync2). In this embodiment, the logic synthesizer 222 performs logic synthesis on the first and second synchronization signals (sync1, sync2) and the enabling signal ($P_{valid}$) so as to generate the first and second driving signals (drive1, drive2), respectively. In particular, the logic synthesizer 222 performs logic AND synthesis on the first and second synchronization signals (sync1, sync2) and the enabling signal ($P_{valid}$) so as to generate the first and second driving signals (drive1, drive2), respectively. However, the present invention is not limited in this aspect.

The high signal level of the enabling signal ($P_{valid}$) corresponds to the working period of the first and second driving signals (drive1, drive2), during which period each of the first and second driving signals (drive1, drive2) switches between high and low signal levels at a frequency that is substantially equal to that of a corresponding one of the first and second synchronization signals (sync1, sync2). The low signal level of the enabling signal ($P_{valid}$) corresponds to a non-working period of the first and second driving signals (drive1, drive2), during which period the first or second driving signal (drive1, drive2) is maintained at the low signal level.

In the exemplary waveforms illustrated in FIG. 6(V) and FIG. 6(VI), each of the first and second driving signals (drive1, drive2) has several (i.e., two or more) consecutive periods, with each non-working period being provided between two adjacent ones of the working periods.

Therefore, since the first and second driving signals (drive1, drive2) are maintained at the low signal level during the non-working period when the enabling signal ($P_{valid}$) is at the low signal level, the first and second transistors (Q1, Q2) of the switch unit 11 are not switched at all during this period, thereby reducing the number of switching actions of the first and second transistors (Q1, Q2).

In addition, since the enabling signal ($P_{valid}$) is in sync with the first and second synchronization signals (sync1, sync2), it is ensured that switching points of the first and second driving signals (drive1, drive2) generated after logic synthesis by the logic synthesizer 222 coincide with each other, so as to achieve soft switching of the switch unit 11.

In step 66, steps 61 to 65 are repeated until the resonant direct current/direct current converter 1 ceases to receive the input power 31.

With the control method as presented above, the present invention makes the duty cycle of the correcting signal ($P_{correct}$) to be at 100% when the output current ($I_{out}$) is at least equal to the correcting threshold value (reg_correct_thrd) (i.e., a relatively heavy load condition for the resonant direct current/direct current converter 1), such that the enabling signal ($P_{valid}$) is maintained at the high signal level to thereby take the first and second synchronization signals (sync1, sync2) outputted by the frequency modulation controller 21 respectively as the first and second driving signals (drive1, drive2). Furthermore, the output voltage is maintained unchanged by changing the duty cycle of the correcting signal ($P_{correct}$) when the external load 32 changes. In addition, the present invention decreases the duty cycle of the correcting signal ($P_{correct}$) as the output current ($I_{out}$) decreases when the output current ($I_{out}$) is smaller than the correcting threshold value (reg_correct_thrd) (i.e., a relatively light load condition for the resonant direct current/direct current converter 1), which in turn makes the duty cycle of the enabling signal ($P_{valid}$) to be at less than 100% (i.e., the enabling signal ($P_{valid}$) has both high and low signal levels) to thereby maintain the first and second driving signals (drive1, drive2) at the low signal level during the non-working periods when the enabling signal ($P_{valid}$) is at the low signal level, such that the number of pulses in the first and second driving signals (drive1, drive2) is reduced as compared to the prior art to thereby effectively reduce the number of switching actions of the first and second transistors (Q1, Q2) of the switch unit 11 of the resonant direct current/direct current converter 1.

Figure 1:
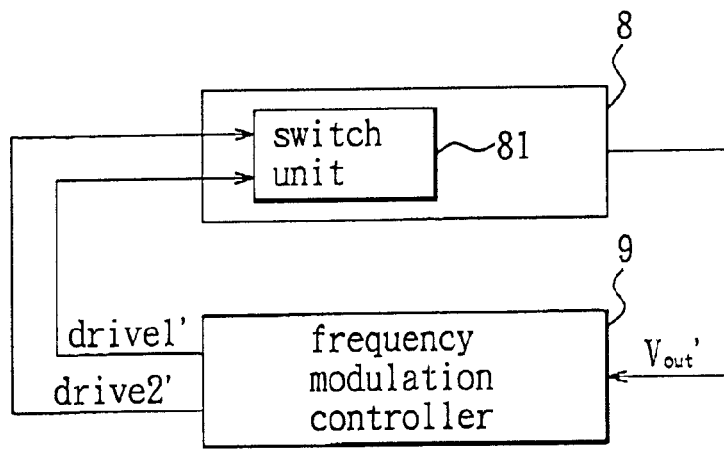
FIG. 1 is a block diagram of a conventional LLC half bridge resonant direct current/direct current converter.
Figure 2I:
FIG. 2(I) to FIG. 2(III) are waveform diagrams, illustrating a plurality of signals relevant to operation of the conventional LLC half bridge resonant direct current/direct current converter.
Figure 2:
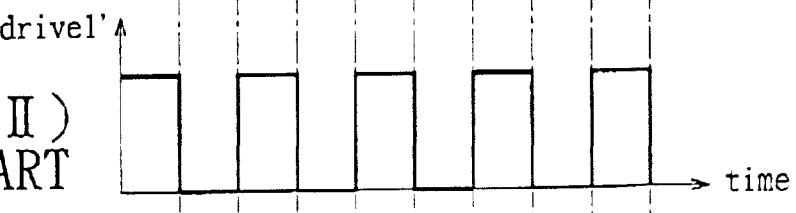

It should be noted herein that under a relatively light load condition, the first and second driving signals (drive1', drive2') outputted by the frequency modulation controller 9 for the conventional resonant direct current/direct current converter 8 of FIG. 1 have a relatively high frequency as illustrated by the dashed lines in FIG. 6(V) and FIG. 6(VI), respectively. As the frequency increases for the first and second driving signals (drive1', drive2'), the energy being transferred by the switch unit 81 driven thereby per period decreases, thereby reducing the power conversion efficiency in the prior art.

In contrast, under the same relatively light load condition, the first and second driving signals (drive1, drive2) outputted by the control device 2 of the present invention for the resonant direct current/direct current converter 1 as illustrated by the solid lines in FIG. 6(V) and FIG. 6(VI), respectively, have a relatively low frequency. Furthermore, in order to reduce the number of switching actions of the first and second switches (Q1, Q2) of the switch unit 11 while maintaining energy transfer, the control device 2 of the present invention uses the clamped adjusting voltage as the input of the voltage controlled oscillator 212 when the output current ($I_{out}$) is smaller than the correcting threshold voltage (reg_correct_thrd) so as to fix the frequency of the first and second synchronization signals (sync1, sync2) to be smaller than that of the prior art, such that the resonating current ($I_s$) (as shown by a solid line in FIG. 6(VII)) flowing through the first inductor (L1) has a smaller frequency than that of the prior art (as shown by a dashed line in FIG. 6(VII)).

It should be noted herein that amplitudes of the first and second driving signals (drive1', drive2') of the prior art, represented by the dashed lines in FIG. 6(V) and FIG. 6(VI), and amplitudes of the first and second driving signals (drive1, drive2) of the present invention, represented by the solid lines in FIG. 6(V) and FIG. 6(VI), are purposely made to be different so as to more easily distinguish them from one another. In reality, the most noticeable difference between the first and second driving signals (drive1', drive2') of the prior art and the first and second driving signals (drive1, drive2) of the present invention lies in the frequency, and not in the amplitude.

With reference to FIG. 7, there is shown a plot of power conversion efficiency (η) of the resonant direct current/direct current converter 1 versus load index (Po) of the external load 32 for the preferred embodiment. When the load index (Po) is a value such that the resonant direct current/direct current converter 1 operates in an optimal operating point as determined with respect to the resonating unit 12, the resonant direct current/direct current converter 1 has the highest power conversion efficiency (η), and the load index (Po) is said to have an optimal load value.

Shown using a dashed line in FIG. 7, in the prior art, under the control of the frequency modulation controller 9 of FIG. 1, when the load index (Po) is slightly smaller than the optimal load value, the power conversion efficiency (η) drops drastically.

On the other hand, shown using a solid line in FIG. 7, under the control of the control device 2 according to the present invention, when the correcting threshold value (reg_correct_thrd) is set to be a value of the output current ($I_{out}$) at a highest value of the power conversion efficiency (η), if the load index (Po) is slightly smaller than the optimal load value (i.e., a relatively light load condition) such that the input current ($I_{out}$) is smaller than the correcting threshold value (reg_correct_thrd), the pulse width modulator 221 decreases the duty cycle of the correcting signal ($P_{correct}$) so as to increase the power conversion efficiency (η). Consequently, the power conversion efficiency (η) does not drop drastically as in the prior art when the load index (Po) is slightly smaller than the optimal load value.

It should be noted herein that the correcting threshold value (reg_correct_thrd) is equal to the value of the output current ($I_{out}$) at the optimal power conversion efficiency (η) in this embodiment, but is not limited thereto and can be adjusted according to actual use conditions in other embodiments of the present invention.

In addition, although the output current ($I_{out}$) is the judgment factor in step 61 in this embodiment, an output power of the resonant direct current/direct current converter 1 may also be compared with a corresponding threshold value for the same purpose in other embodiments of the present invention.

It should be further noted herein that when adopting digital control, the pulse selector 22 may have an alternative implementation, where the pulse selector 22 generates a cycle count according to switching points of the first and second synchronization signals (sync1, sync2), and determines according to the output information when the cycle count is equal to what value for taking the first and second synchronization signals (sync1, sync2) respectively as the first and second driving signals (drive1, drive2) and when the cycle count is equal what value for making the first and second driving signals (drive1, drive2) remain at the low signal level.

To summarize, when the external load 32 to a resonant direct current/direct current converter 1 becomes lighter, the control device 2 for the resonant direct current/direct current converter 1 suitably adjusts the number of pulses in the first and second driving signals (drive1, drive2) according to the output current ($I_{out}$) of the resonant direct current/direct current converter 1 so as to reduce the number of switching actions of the first and second transistors (Q1, Q2) of the switch unit 11 of the resonant direct current/direct current converter 1 in order to increase the power conversion efficiency (η) when the external load 32 is slightly lighter than an optimal load value, while maintaining power transfer. Furthermore, since the switching points of the first and second driving signals (drive1, drive2) are identical, soft switching can be achieved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A control device adapted for use in a resonant direct current/direct current converter for controlling a switch unit of the resonant direct current/direct current converter, said control device comprising:

a frequency modulation controller adapted to be coupled electrically to the resonant direct current/direct current converter for receiving a correcting threshold value and output information of the resonant direct current/direct current converter, and for generating a synchronization signal according to the correcting threshold value and the output information received thereby; and a pulse selector adapted to be coupled electrically to the resonant direct current/direct current converter and said frequency modulation controller for receiving the output information, the correcting threshold value and the synchronization signal, and for generating a driving signal according to the output information, the correcting threshold value and the synchronization signal received thereby;

wherein the driving signal is adapted to drive the switch unit of the resonant direct current/direct current converter, and has a working period, the driving signal switching between high and low signal levels at a frequency that is substantially equal to that of the synchronization signal during the working period.

2. The control device as claimed in claim 1, wherein said pulse selector further generates an enabling signal according to the output information of the resonant direct current/direct current converter, said pulse selector generating the driving signal according to the enabling signal and the synchronization signal such that a high signal level of the enabling signal corresponds to the working period of the driving signal, and a low signal level of the enabling signal corresponds to a non-working period of the driving signal, during which period the driving signal is maintained at the low signal level.

3. The control device as claimed in claim 2, wherein the enabling signal has a frequency smaller than that of the synchronization signal.

4. The control device as claimed in claim 2, wherein the output information of the resonant direct current/direct current converter includes an output voltage and an output current, said pulse selector including a pulse width modulator for generating a correcting signal having a duty cycle that is determined by the output information to make sure the output voltage has a substantially unchanged value, and for generating the enabling signal from the correcting signal with reference to the synchronization signal.

5. The control device as claimed in claim 4, wherein the frequency of the synchronization signal varies inversely with the output current of the resonant direct current/direct current converter when the output current is larger than the correcting threshold value, the frequency of the synchronization signal being fixed when the output current is smaller than the correcting threshold value, the duty cycle of the correcting signal being decreased as the output current decreases when the output current is smaller than the correcting threshold value, the duty cycle of the correcting signal being 100% when the output current is at least equal to the correcting threshold value such that the correcting signal is maintained at the high signal level.

6. The control device as claimed in claim 2, wherein said pulse selector includes a logic synthesizer for performing logic synthesis on the synchronization signal and the enabling signal so as to generate the driving signal.

7. The control device as claimed in claim 6, wherein said logic synthesizer performs logic AND synthesis on the synchronization signal and the enabling signal so as to generate the driving signal.

8. The control device as claimed in claim 1, wherein said frequency modulation controller is a variable frequency controller.

9. The control device as claimed in claim 1, wherein said frequency modulation controller includes a voltage adjuster for generating an adjusting voltage by comparing the output information with a reference voltage, and a voltage controlled oscillator for generating the synchronization signal according to the adjusting voltage.

10. The control device as claimed in claim 9, wherein the adjusting voltage is clamped when the output current is smaller than the correcting threshold value so that the frequency of the synchronization signal is fixed under this condition.

* * * * *